United States Patent [19]

Yamada

[11] 4,079,333
[45] Mar. 14, 1978

[54] AUDIO AMPLIFIER

[75] Inventor: Yoichiro Yamada, Tokyo, Japan

[73] Assignee: Trio Kabushiki Kaisha, Tokyo, Japan

[21] Appl. No.: 758,758

[22] Filed: Jan. 12, 1977

[30] Foreign Application Priority Data

May 17, 1976 Japan .................................51-56180

[51] Int. Cl.² ............................................. H03F 3/68
[52] U.S. Cl. ................................ 330/124 R; 330/200; 330/295; 330/297
[58] Field of Search .................... 330/22, 30 R, 124 R, 330/199, 200; 179/1 G, 100.4 ST

[56] References Cited
U.S. PATENT DOCUMENTS 3,394,235  7/1968  Schott ........................ 179/100.4 ST

OTHER PUBLICATIONS

Musen to Jikken, Oct., 1975, p. 28
De Sa, "Build a Cop 30/30 Transistor Stereo Amplifier," Radio-Electronics, Jul. 1966, pp. 48-51.
Dempa Shinbun Sep. 9, 1975 p. 11.

Primary Examiner—James B. Mullins
Attorney, Agent, or Firm—Gerald J. Ferguson, Jr.; Joseph J. Baker

[57] ABSTRACT

An audio amplifier which processes mainly dynamic signals and which is provided with a plurality of amplifying systems each having a preamplifier and a main amplifier. A plurality of power sources are used to separately supply electric power to the respective amplifying systems, resulting in elimination of transient crosstalk.

1 Claim, 8 Drawing Figures

4,079,333

AUDIO AMPLIFIER

BACKGROUND OF THE INVENTION

The present invention relates to a new and improved audio amplifier of the type including a plurality of amplifying systems each having a preamplifier and a main amplifier.

With the prevalence of the so-called audio component systems, higher performance has become an important and requisite factor in present day audio systems. In audio amplifiers, a tendency toward increased power is very noticeable, the purpose of which is to improve sound quality in addition to increasing capacity and enhancing stability.

The power source in the audio amplifier generally is not taken seriously since its construction is simple as compared with that of its associated amplifier circuitry. In designing the totality of an audio system, however, the power source is very important since it occupies a considerable part of the total weight and space of the audio system. In designing a power source, a hearing test was conducted by varying the power source voltage to follow the envelope of the musical sound at a low frequency. In the test, it was found that, when a low frequency signal was applied to the amplifier system, the localization of the sound image transiently varied with the power source voltage variation, and when a small signal of high frequency was applied, a noisy sound was produced. From this, the presumption was made that, when a signal was applied to the amplifying system of one of channels in the audio amplifier, power source voltage variation corresponding to the envelope of the input signal takes place in the power source circuit of the audio amplifier. The voltage variation causes the operation points of the amplifying system in other channels to shift, resulting in a transient distortion. This transient distortion does not take place during static operation of an audio amplifier when it receives a continuous wave signal but it is caused by transient variations which occur when the audio amplifier receives a dynamic or transient signal such as a musical sound signal. The distortion is generally called dynamic crosstalk or transient crosstalk. In this specification, it will be referred to as transient crosstalk.

Various attempts have therefore been made with a view to eliminating the transient crosstalk. Examples of such attempts are to stabilize the voltage of the power source circuit and to lower the power source impedance. None of these attempts have, however, been fully successful.

SUMMARY OF THE INVENTION

Accordingly, a primary object of the present invention is to provide an audio amplifier providing a stable localization of the sound image without being effected by transient crosstalk.

In the present invention the object is achieved by providing separate individual power source circuits for the respective amplifying systems where the amplifying system in each includes a preamplifier for processing a weak signal and a main or power amplifier for processing a high power signal in the audio amplifier.

Other objects and features in the present invention will be apparent from the following description taken in connection with the accompanying drawings.

DETAILED DESCRIPTION OF THE PREFERRED EMBODIMENT OF THE INVENTION

Figure 1:
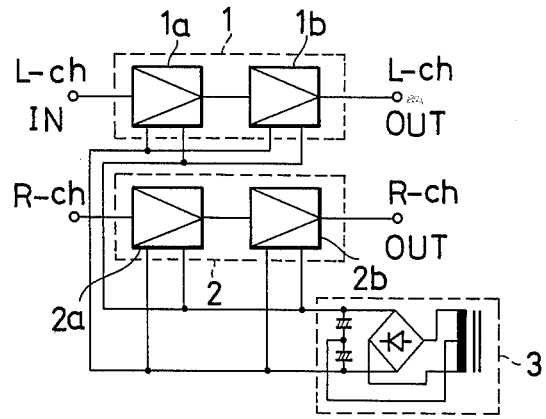
FIG. 1 illustrates, by way of a block and schematic circuit diagram, a conventional audio amplifier.

Before describing an embodiment of the present invention, a conventional audio amplifier will be described for a better understanding of the present invention. In the accompanying drawings, the same part or its equivalent part is designated by the same reference numeral.

Reference is now made to FIG. 1 which illustrates a conventional audio amplifier. In the figure, the audio amplifier comprises an amplifying system 1 for the left-hand channel including a preamplifier 1a for handling weak signals and a power amplifier 1b for handling the high power signal and another amplifying system 2 for the right-hand channel including likewise a preamplifier 2a and a power amplifier 2b. In the audio amplifier, all of the amplifier components 1a, 1b, 2a and 2b are commonly supplied from a single power source 3 of appropriate circuit construction.

As previously described, the transient crosstalk is caused by the applied dynamic signals. For measuring transient crosstalk, therefore, the measuring circuit shown in FIG. 2 was employed.

Figure 2:
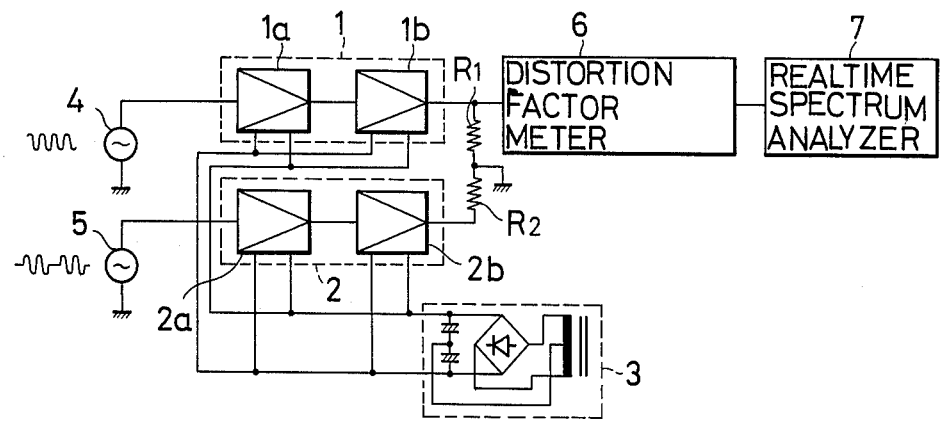
FIG. 2 illustrates, by way of a block and schematic circuit diagram, a distortion measuring circuit for the FIG. 1 audio amplifier.

More precisely, the measurement of transient crosstalk was made with a continuous wave signal applied to the amplifying system of one channel while a dynamic signal having a tone burst waveform was applied to the other channel amplifying system. The measurement circuit was assembled as shown in FIG. 2 where a continuous wave source 4 was connected to the input of amplifying system 1 and a tone burst wave signal source 5 was connected to the input of amplifying system 2 of the right-hand channel. The output of amplifying system 1 of the left-channel was coupled to a distortion factor meter 6 for measuring the distortion factor of the continuous wave signal outputted from amplifying system 1. The distortion factor meter 6 was further connected to a realtime spectrum analyzer 7 for analyzing the spectrum of the output signal from distortion factor meter 6. The output of amplifying system 1 was also terminated by a termination resistor $R_1$. The amplifying system 2 of the right-hand channel was terminated at its output by a termination resistor $R_2$.

In the measurement, the continuous signal from the continuous signal source 4 had a frequency of 1 KHz. Twenty four tone burst wave signals each of 60 Hz were repeatedly applied to right channel 2 with a repetition period of 1 second.

Figure 3:
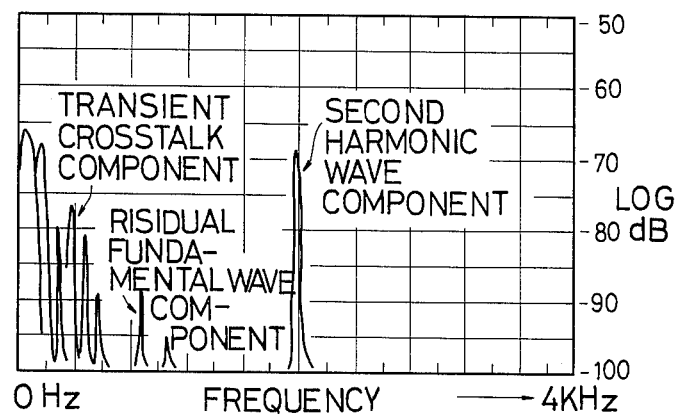
FIG. 3 shows a frequency spectrum measured by the measuring circuit of FIG. 2.
Figure 4:
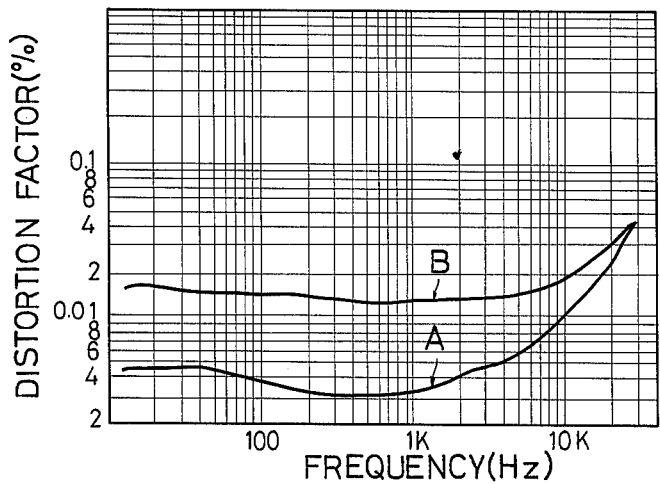
FIG. 4 shows a graph illustrating the distortion characteristic of the conventional audio amplifier of FIG. 1.

The results of the measurement are shown in FIGS. 3 and 4. The frequency spectrum measured by the realtime spectrum analyzer 7 is shown in FIG. 3, and the distortion factor characteristic of the conventional audio circuit measured by the distortion meter 6 is shown in FIG. 4. As seen from FIG. 3, a large amount of transient crosstalk components is observed localized at the low frequency retion. This fact is important since the musical sound generally applied to an audio amplifier has an energy distribution weighted toward the low frequency region. That is, the transient crosstalk distributed in the low frequency region noticeably affects the sound quality of the musical sound reproduced by the audio amplifier. In FIG. 4, the distortion factor curve labeled B is the one of the continuous wave signal plotted by varying its frequency while feeding the tone burst signals to the right-hand channel amplifying system 2 in the above-mentioned manner. The distortion curve labeled A with lower distortion than curve B distortion is the measurement of the continuous wave output without applying the tone burst waves to the right-hand channel amplifying system 2. From the results of the measurement, it will be understood that the transient signal applied to one channel amplifying system causes a transient crosstalk to the other channel amplifying system through the common power source. So far as the present inventor knows, this transient crosstalk has not been confirmed by measurements using continuous wave signals and was confirmed by the above measurements using tone burst wave signals.

Thus, the result of the above experiment establishes the presumption of the present inventor was correct — that is, the transient crosstalk due to the application of transient signals is effected through the common power source circuit conventionally used for the amplifier components of the respective channels.

This fact leads to the present invention in which separate power sources are used for the respective amplifying systems of the channels to thereby eliminate the interference of the transient crosstalk through power source circuitry.

Figure 5:
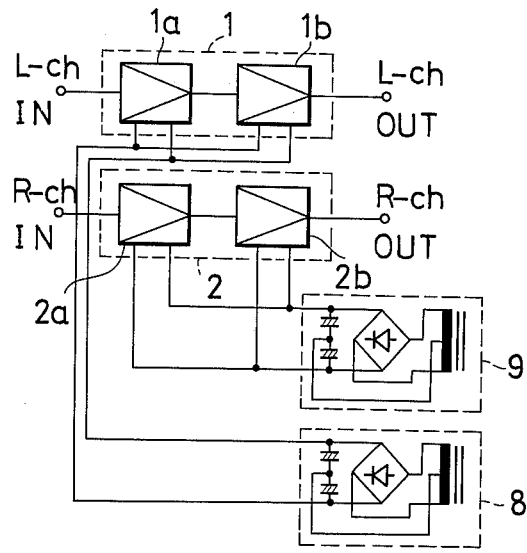
FIG. 5 illustrates, by way of a block and schematic circuit diagram, an audio amplifier according to the present invention.

Turning now to FIG. 5, there is shown an embodiment of an audio amplifier circuit according to the present invention. As shown in the figure, two separate power source circuits 8 and 9 are used to feed electric power to the amplifying system 1 of the left-hand channel and 2 of the right-hand channel, respectively. Like the FIG. 1 circuit, the left-hand channel amplifying system 1 includes preamplifier 1a and power amplifier 1b and right-hand channel amplifying system 2 includes preamplifier 2a and power amplifier 2b.

Figure 6:
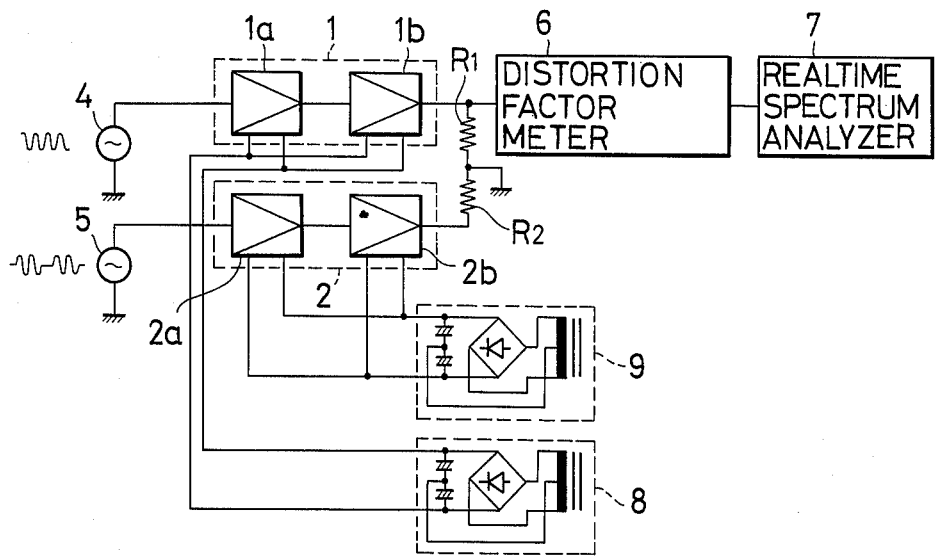
FIG. 6 illustrates, by way of a block and schematic circuit diagram, a distortion measuring circuit for the FIG. 5 audio amplifier.

With respect to transient crosstalk, the audio amplifier of FIG. 5 was tested by applying the transient crosstalk measurement method of FIG. 2 to the FIG. 5 circuitry, as shown in FIG. 6. In FIG. 6, a continuous signal from continuous signal source 4 was fed to amplifying system 1 whose output was connected to distortion factor meter 6 which in turn was connected to realtime spectrum analyzer 7. A series of tone burst signals were fed from tone burst wave signal source 5 to amplifying system 2, the output of which was terminated by terminating resistor $R_2$. The frequency of the continuous wave was the same as in the FIG. 2 measurement and the number and the frequency of the tone burst wave signals was likewise the same as those in the FIG. 2 case.

Figure 7:
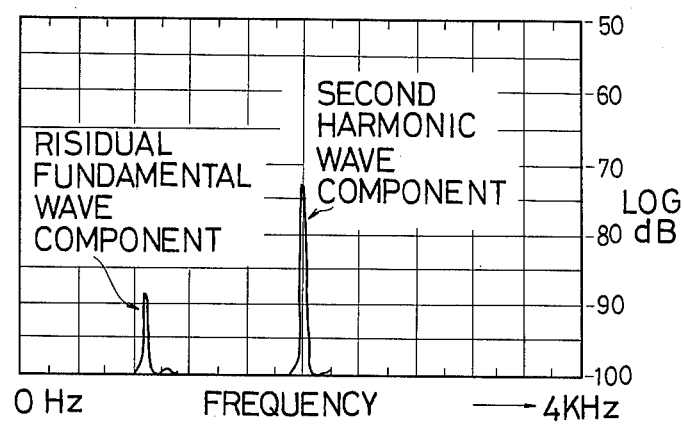
FIG. 7 shows a frequency spectrum measured by the measuring circuit of FIG. 6.
Figure 8:
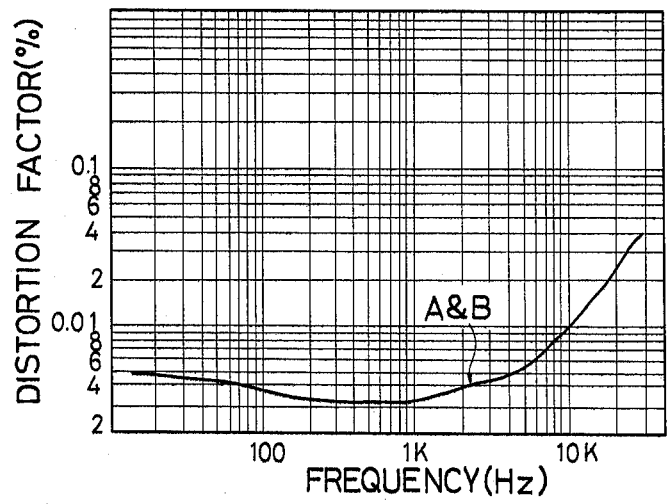
FIG. 8 shows a graph illustrating the distortion characteristic of the audio amplifier according to the present invention shown in FIG. 5.

The measurement results are shown in FIGS. 7 and 8. As seen in FIG. 7 illustrating the frequency spectrum measured by the spectrum analyzer 7, no transient crosstalk is observed. Further, the distortion characteristic graph of FIG. 8 shows that the distortion factor curves A and B completely coincide with each other. As will be recalled, the distortion factor curve A is the distortion of the continuous wave when no tone burst wave signals are applied to amplifying system 2, and curve B results when 24 tone burst wave signals are applied to amplifying system 2. In other words, the curve B indicates the distortion curve of the continuous wave signal when the audio amplifier is subjected to dynamic or transient signals such as musical sound signals. From the FIG. 8 graph, it will be seen, therefore, that no transient crosstalk effect exists in the audio amplifier of the present invention.

Various other modifications of the disclosed embodiment will be apparent to the person skilled in the art without departing from the spirit and scope of the invention as defined by the appended claim.

What is claimed is:

1. A stereo audio amplifier comprising
 a first amplifying system including a first preamplifier and a first power amplifier responsive to said first preamplifier;
 a first power supply means including first rectifying means responsive to alternating current applied thereto for supplying power, said first preamplifier and said first power amplifier having power supplied thereto only by said first power supply means;
 a second amplifying system including a second preamplifier and a second power amplifier responsive to said second preamplifier; and
 a second power supply means including second rectifying means responsive to alternating current applied thereto for supplying power, said second preamplifier and said second power amplifier having power supplied thereto only by said second power supply means so that cross talk is completely eliminated between said first and second amplifying systems due to the coupling of (1) said first preamplifier and said first power amplifier only to said first power supply means and (2) said second preamplifier and said second power amplifier only to said second power supply means.

* * * * *